United States Patent
Ballantyne et al.

(10) Patent No.: US 8,588,720 B2
(45) Date of Patent: Nov. 19, 2013

(54) SIGNAL DECIMATION TECHNIQUES

(75) Inventors: Gary J. Ballantyne, San Diego, CA (US); Jifeng Geng, San Diego, CA (US); Bo Sun, San Diego, CA (US)

(73) Assignee: QUALCOMM Incorproated, San Diego, CA (US)

( * ) Notice: Subject to any disclaimer, the term of this patent is extended or adjusted under 35 U.S.C. 154(b) by 369 days.

(21) Appl. No.: 12/638,822

(22) Filed: Dec. 15, 2009

(65) Prior Publication Data

US 2011/0143689 A1    Jun. 16, 2011

(51) Int. Cl.
*H04B 1/06* (2006.01)
*H04B 7/00* (2006.01)

(52) U.S. Cl.
USPC ........... 455/260; 455/255; 455/257; 455/258; 455/259; 455/183.1; 455/183.2; 327/113; 327/117; 327/118; 327/291; 327/299; 331/60; 331/61

(58) Field of Classification Search
USPC ........... 455/254–265, 146–147, 182.1–182.3, 455/183.1–183.2; 327/113–121, 144–162, 327/291–299; 331/60–61
See application file for complete search history.

(56) References Cited

U.S. PATENT DOCUMENTS

| | | | |
|---|---|---|---|
| 5,491,673 A | 2/1996 | Okayasu | |
| 5,701,594 A | 12/1997 | Bath et al. | |
| 5,907,253 A | 5/1999 | Davis et al. | |
| 5,929,682 A | 7/1999 | Kazuya et al. | |
| 5,937,339 A * | 8/1999 | Vigne | 455/260 |
| 6,160,856 A | 12/2000 | Gershon | |
| 6,185,411 B1 * | 2/2001 | Gillig et al. | 455/260 |
| 6,563,387 B2 * | 5/2003 | Hirano et al. | 331/11 |
| 6,788,668 B1 | 9/2004 | Shah et al. | |
| 6,826,247 B1 | 11/2004 | Elliott et al. | |
| 7,260,375 B2 * | 8/2007 | Ash | 455/260 |
| 7,274,231 B1 | 9/2007 | Gillespie et al. | |
| 7,482,885 B2 | 1/2009 | Sridharan | |
| 7,483,508 B2 | 1/2009 | Staszewski et al. | |
| 7,505,737 B2 * | 3/2009 | Park | 455/63.1 |
| 7,609,199 B2 * | 10/2009 | Nishijima et al. | 342/175 |
| 7,613,267 B2 * | 11/2009 | Perrott et al. | 375/376 |

(Continued)

FOREIGN PATENT DOCUMENTS

| | | |
|---|---|---|
| EP | 0180450 A2 | 5/1986 |
| EP | 0357527 A2 | 3/1990 |

(Continued)

OTHER PUBLICATIONS

Balabanian, et al., "Digital Logic Design principles", John Wiley & sons publishing, 2001, ISBN 0-471-29351-2, pp. 142-145.

(Continued)

*Primary Examiner* — Tuan A Tran
(74) *Attorney, Agent, or Firm* — Kevin T. Cheatham

(57) ABSTRACT

Techniques for decimating a first periodic signal to generate a second periodic signal. In an exemplary embodiment, the first periodic signal is divided by a configurable integer ratio divider, and the output of the divider is delayed by a configurable fractional delay. The configurable fractional delay may be noise-shaped using, e.g., sigma-delta modulation techniques to spread the quantization noise of the fractional delay over a wide bandwidth. In an exemplary embodiment, the first and second periodic signals may be used to generate the transmit (TX) and receive (RX) local oscillator (LO) signals for a communications transceiver from a single phase-locked loop (PLL) output.

30 Claims, 9 Drawing Sheets

(56) References Cited

U.S. PATENT DOCUMENTS

| | | | |
|---|---|---|---|
| 7,729,440 | B2 | 6/2010 | Dussarat et al. |
| 7,817,768 | B2 * | 10/2010 | Beyer et al. .................. 375/376 |
| 7,885,369 | B2 * | 2/2011 | Beyer et al. .................. 375/376 |
| 8,044,742 | B2 | 10/2011 | Sun |
| 2003/0016762 | A1 | 1/2003 | Martin et al. |
| 2003/0058053 | A1 | 3/2003 | Jeon et al. |
| 2003/0067359 | A1 | 4/2003 | Darabi et al. |
| 2003/0092419 | A1 * | 5/2003 | Nobbe et al. .................. 455/324 |
| 2003/0099321 | A1 | 5/2003 | Juan et al. |
| 2004/0087297 | A1 * | 5/2004 | Ash .................. 455/290 |
| 2005/0153669 | A1 | 7/2005 | Suzuki et al. |
| 2005/0280473 | A1 | 12/2005 | Puma et al. |
| 2006/0066368 | A1 | 3/2006 | Gabato et al. |
| 2006/0198426 | A1 | 9/2006 | Partyka |
| 2007/0015471 | A1 | 1/2007 | Cook et al. |
| 2007/0049330 | A1 * | 3/2007 | Kim et al. .................. 455/552.1 |
| 2007/0164835 | A1 | 7/2007 | Co |
| 2007/0242026 | A1 | 10/2007 | Julian et al. |
| 2007/0291875 | A1 | 12/2007 | Lee et al. |
| 2008/0003954 | A1 * | 1/2008 | Matsuno .................. 455/88 |
| 2008/0037662 | A1 | 2/2008 | Ravi et al. |
| 2008/0042706 | A1 | 2/2008 | Yang et al. |
| 2008/0129386 | A1 | 6/2008 | Zipper |
| 2008/0191750 | A1 | 8/2008 | Wang |
| 2009/0163166 | A1 * | 6/2009 | Lin .................. 455/260 |
| 2009/0168942 | A1 | 7/2009 | Choi et al. |
| 2009/0190694 | A1 | 7/2009 | Kobayashi |
| 2010/0136937 | A1 | 6/2010 | Shute et al. |
| 2010/0207693 | A1 | 8/2010 | Fagg |
| 2011/0275313 | A1 | 11/2011 | Baldemair et al. |
| 2011/0304368 | A1 | 12/2011 | Sun |
| 2012/0139592 | A1 | 6/2012 | Bo et al. |

FOREIGN PATENT DOCUMENTS

| | | | |
|---|---|---|---|
| JP | 9261048 A | | 10/1997 |
| JP | 10304000 A | | 11/1998 |
| JP | 2004527953 A | | 9/2004 |
| JP | 2004289355 A | | 10/2004 |
| JP | 2005203960 A | | 7/2005 |
| JP | 2008136031 A | | 6/2008 |
| JP | 2009303212 A | | 12/2009 |
| KR | 20090079110 A | | 7/2009 |
| TW | 387130 B | | 4/2000 |
| TW | 200718024 | | 5/2007 |
| WO | WO9938252 A1 | | 7/1999 |
| WO | 02080484 A1 | | 10/2002 |
| WO | 2007046061 A2 | | 4/2007 |

OTHER PUBLICATIONS

International Search Report and Written Opinion—PCT/US2010/060585, ISA/EPO—Jul. 11, 2011.

Su P. E., et al., "A 2.4 GHz Wideband Open-Loop GFSK Transmitter With Phase Quantization Noise Cancellation", IEEE Journal of Solid-State Circuits, vol. 46, No. 3, Mar. 2011, pp. 615-626.

Philippe, P.; , "A zero crossing avoidance predistortion technique for polar transmitters," Electronics, Circuits and Systems, 2008. ICECS 2008. 15th IEEE International Conference on , v pp. 814-817, Aug. 31, 2008-Sep. 3, 2008.

Wang, et al., "Vector Hole Punching Technique for OFDM Signals Using Circle-Tangent Shift and Unused Tones," IEEE Transactions on Microwave Theory and Techniques, vol. 57, No. 11, pp. 2682-2691, Nov. 2009.

Youssef, et al., "A low-power wideband polar transmitter for 3G applications," Solid-State Circuits Conference Digest of Technical Papers (ISSCC), 2011 IEEE International , pp. 378-380, Feb. 20-24, 2011.

Arias, et al. "Nonlineary Corecton for Multbit ? ? DACs," IEEE Transactons on Circuits and Sysems-I, Reguar Papers, vol. 52, No. 6, Jun. 2005, pp. 1033-1041.

Nagaraj, et al., "A Self-Calibrating Sub-Picosecond Resolution Digital-to-Time Converter," Microwave Symposium, 2007. IEEE/MTT-S International, Jun. 3-8, 2007, pp. 2201-2204.

Taiwan Search Report—TW099144287—TIPO—Jun. 25, 2013.

* cited by examiner

SIGNAL DECIMATION TECHNIQUES

BACKGROUND

1. Field

The disclosure relates to circuit design, and in particular, to techniques for decimating periodic signals such as local oscillator signals.

2. Background

Modern communications devices are often required to process two or more signals having different carrier frequencies. For example, a communications transceiver may simultaneously transmit TX signals on one or more TX carrier frequencies, and receive RX signals on one or more RX carrier frequencies. The TX and RX frequency bands may be separated from each other by a duplex offset frequency.

To accommodate the multiple carrier frequencies, a single communications device may employ multiple phase-locked loops (PLL's) to simultaneously generate the desired frequencies. However, multiple PLL's may consume considerable die area on an integrated circuit, leading to higher cost.

It would be desirable to provide techniques for generating multiple carrier frequencies from a single PLL output by, e.g., decimating the signal generated by the PLL, and mixing the component signals to produce the desired carrier frequencies. It would be further desirable to generally apply such techniques to decimating an arbitrary periodic signal to generate another periodic signal of lower frequency.

SUMMARY

An aspect of the present disclosure provides a method comprising decimating a first periodic signal to generate a second periodic signal, the decimating comprising dividing the first periodic signal by a configurable integer ratio to generate an intermediate signal; and delaying the intermediate signal by a configurable delay to generate the second periodic signal.

Another aspect of the present disclosure provides an apparatus comprising: an integer division block configured to divide the frequency of a first periodic signal by a configurable integer ratio to generate an intermediate signal; and a delay block configured to delay the intermediate signal by a configurable delay to generate the second periodic signal.

Yet another aspect of the present disclosure provides an apparatus comprising means for decimating a first periodic signal to generate a second periodic signal.

Yet another aspect of the present disclosure provides a device for wireless communications, the device comprising at least one baseband TX amplifier for amplifying an analog TX signal, an LO signal generator comprising a TX LO signal generator and an RX LO signal generator, an upconverter coupled to the TX LO signal generator and the at least one baseband TX amplifier, a TX filter coupled to the output of the upconverter, a power amplifier (PA) coupled to the TX filter, an RX filter, a low-noise amplifier (LNA) coupled to the RX filter, a downconverter coupled to the RX LO signal generator and the RX filter, and at least one low-pass filter coupled to the output of the downconverter, the LO signal generator comprising: an integer division block configured to divide the frequency of a first periodic signal by a configurable integer ratio to generate an intermediate signal; and a delay block configured to delay the intermediate signal by a configurable delay to generate the second periodic signal; at least one of the TX LO signal generator and the RX LO signal generator configured to buffer the first periodic signal as the LO signal.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
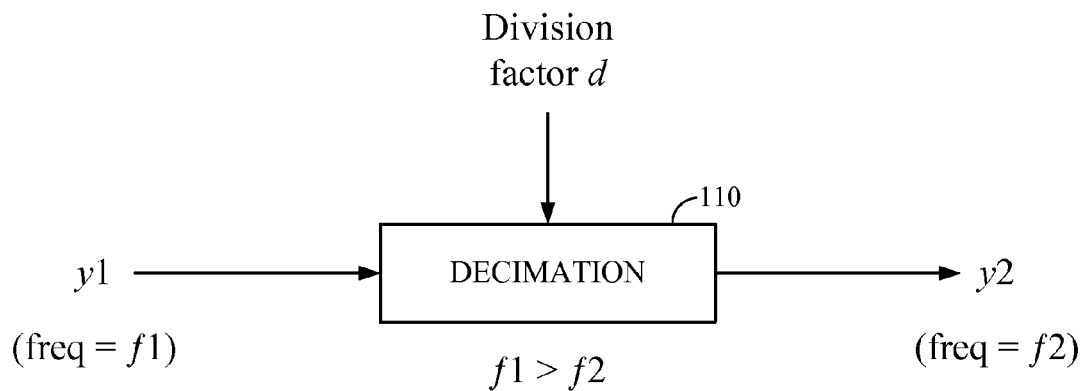
FIG. 1 illustrates an exemplary embodiment of a decimation block according to the present disclosure.

FIG. 1 illustrates an exemplary embodiment of a decimation block 110 according to the present disclosure. In FIG. 1, block 110 accepts an input, or first, periodic signal y1 having frequency f1. In an exemplary embodiment, the input signal y1 may be generated by, e.g., a PLL for a communications device. Alternatively, the input signal y1 need not correspond to the output of a PLL, and may correspond instead, e.g., to another reference signal, e.g., a crystal oscillator output signal, etc. From the input signal y1, block 110 generates an output, or second, periodic signal y2 having frequency f2, wherein f2 is lower than f1. The relationship between f2 and f1 may further be specified as $f2=f1/d$, wherein d is a division factor greater than 1. The function performed by block 110 may be understood as decimation, wherein a higher-frequency signal y1 is decimated to generate a lower-frequency signal y2.

Figure 2:
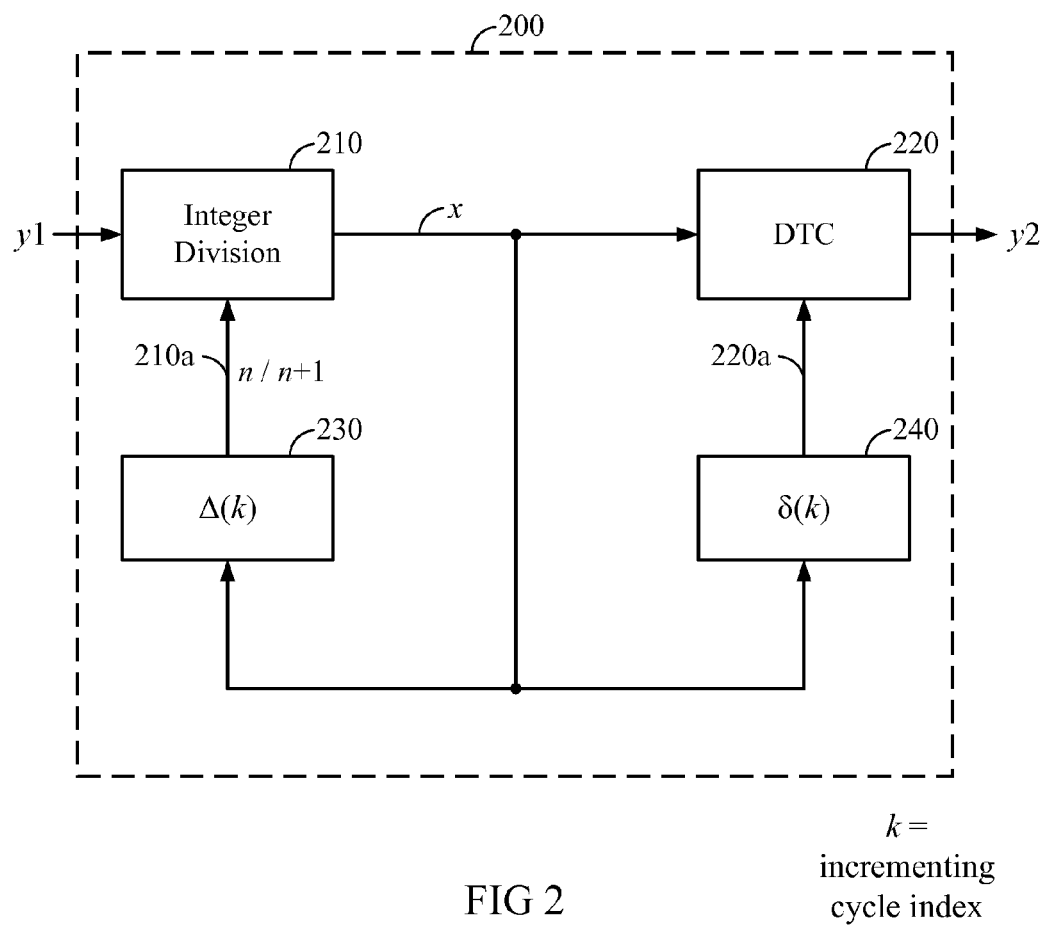
FIG. 2 illustrates an exemplary embodiment of a decimation block according to the present disclosure.

FIG. 2 illustrates an exemplary embodiment 200 of a decimation block 110 according to the present disclosure. In FIG. 2, the input signal y1 is provided to an integer division block 210 to generate a divided, or intermediate, signal x. The signal x has a frequency n or n+1 times less than the frequency of the signal y1, depending on the configuration of the division ratio signal 210a. The signal x is further provided to a digital-to-time converter (DTC) 220, which introduces a time delay to the signal x based on the configuration of a digital delay control signal 220a.

In FIG. 2, the division ratio signal 210a is generated by a ratio generation block 230. The division ratio signal 210a output by block 230 is also denoted herein as Δ(k), wherein k represents a discrete incrementing cycle index. The delay control signal 220a is generated by a delay generation block 240. The delay signal 220a output by block 240 is also denoted herein as δ(k). In the exemplary embodiment shown, blocks 230 and 240 both accept the signal x output by the integer division block 210 as an input. It will be appreciated that the cycle index k may be incremented by trigger events, e.g., rising edges, in the signal x output by block 210.

In an exemplary embodiment, the division ratio signal 210a at a cycle k may be calculated according to the following equation (Equation 1):

$$\Delta(k) = \left\lfloor \frac{f_1}{f_2} k \right\rfloor - \left\lfloor \frac{f_1}{f_2}(k-1) \right\rfloor;$$

wherein the notation $\lfloor a \rfloor$ denotes the floor function applied to a, or the greatest integer less than or equal to a. Furthermore, the delay at a cycle k may be generated according to the following equation (Equation 2):

$$\delta(k) = \frac{1}{f_1} frac\left[\frac{f_1}{f_2} k\right];$$

wherein the notation frac[b] denotes the fractional portion of the number b, and b may generally be a mixed fraction.

From Equations 1 and 2, it will be appreciated that the integer division block 210 decimates the signal y1 by the integer division ratio Δ(k), while the DTC introduces a delay δ(k) that compensates for instantaneous phase error resulting from division by an integer (e.g., as opposed to division by an exact number) at each cycle k. The following table shows exemplary values of Δ(k) and δ(k) versus k for an exemplary embodiment wherein f1/f2=2.25, as computed according to Equations 1 and 2 (Table 1):

| K  | Δ(k) | δ(k) |
|----|------|------|
| 1  | 2    | 0.25 |
| 2  | 2    | 0.5  |
| 3  | 2    | 0.75 |
| 4  | 3    | 0    |
| 5  | 2    | 0.25 |
| 6  | 2    | 0.5  |
| 7  | 2    | 0.75 |
| 8  | 3    | 0    |
| 9  | 2    | 0.25 |
| 10 | 2    | 0.5  |

Figure 3:
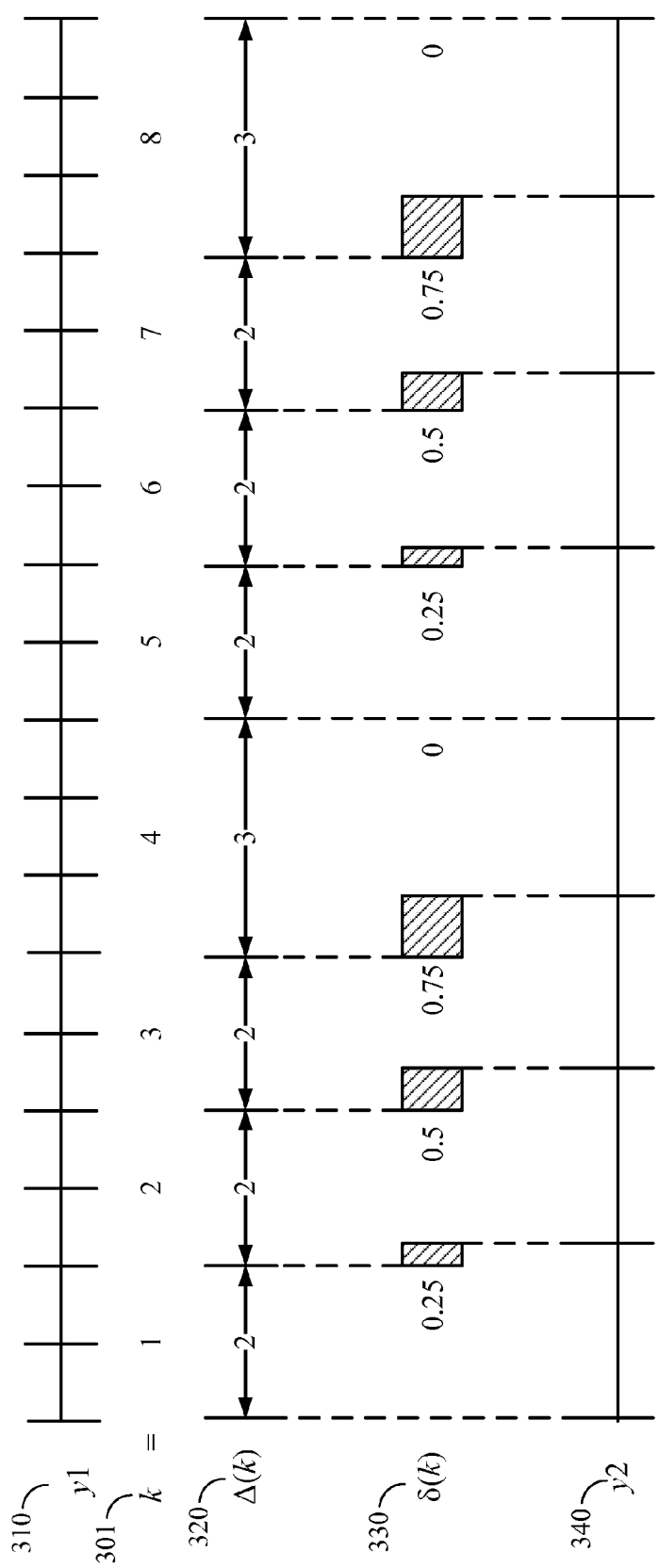
FIG. 3 illustrates an example of the operation of the decimation block for the values shown in Table 1, wherein f1/f2=2.25.

FIG. 3 illustrates an example of the operation of the decimation block 200 for the values shown in Table 1, wherein f1/f2=2.25. Note FIG. 3 is shown for illustrative purposes only, and is not meant to limit the scope of the present disclosure to any particular values shown.

In FIG. 3, a signal y1 is shown at 310. Cycles k are enumerated at 301. At 320, the division ratio Δ(k) as computed from Equation 1 is shown versus k. To generate x, the signal y1 is seen to be divided by a ratio of 2 for k equals 1, 2, and 3, and by a ratio of 3 for k equals 4, etc. At 330, the delay δ(k) as computed from Equation 2 is shown versus k. To generate y2, the signal x is seen to be delayed by corresponding amounts 0.25, 0.5, 0.75, 0, etc. At 340, the signal edges of y2 are shown. It will be appreciated that y2 has a frequency that is approximately 2.25 times less than the frequency of y1, according to the example shown.

Figure 4:
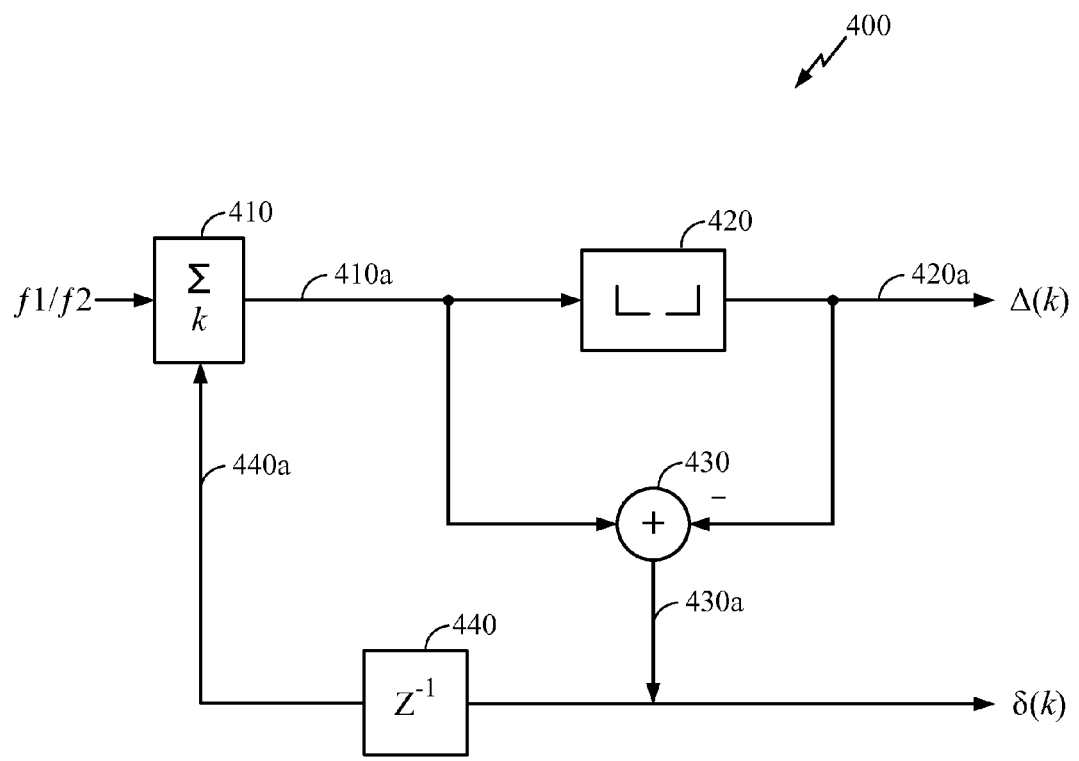
FIG. 4 illustrates an exemplary embodiment of an architecture to compute both $\Delta(k)$ and $\delta(k)$.

One of ordinary skill in the art will appreciate that there are various techniques for computing Equations 1 and 2 to arrive at Δ(k) and δ(k), respectively, e.g., by programming in hardware, firmware, or software. FIG. 4 illustrates an exemplary embodiment 400 of an architecture to compute both Δ(k) and δ(k). Note FIG. 4 is shown for illustrative purposes only, and is not meant to limit the scope of the present disclosure. One of ordinary skill in the art may readily derive alternative architectures for computing Δ(k) and δ(k), and such alternative exemplary embodiments are contemplated to be within the scope of the present disclosure.

In FIG. 4, a first ratio f1/f2 (which ratio is expected to be greater than 1) is input to a clocked summer 410, which also accepts a signal 440a as input. The clocked summer 410 adds f1/f2 to 440a once every cycle k to generate a signal 410a. The signal 410a is provided to a floor function block 420, which outputs a signal 420a corresponding to the greatest integer less than or equal to the value of signal 410a. The signal 420a may also correspond to Δ(k), as computed according to Equation 1.

Further shown in FIG. 4 is a summer 430, which subtracts the signal 420a from the signal 410a to generate a signal 430a. Signal 430a may correspond to δ(k), as computed according to Equation 2. Furthermore, signal 430a is delayed by a delay element 440 to generate the signal 440a, which is provided to the clocked summer 410 as earlier described.

From the description of FIGS. 2 and 3, it will be appreciated that the digital-to-time converter (DTC) 220 is designed to convert the digital delay δ(k) into a continuous-time delay for delaying the signal x. In certain situations, quantization error may be present in the digital-to-time conversion, e.g., when the value of the delay computed according to Equation 2 is not precisely represented by the digital precision of either δ(k) or the DTC 220. In an aspect of the present disclosure, δ(k) may be further processed using noise-shaping techniques to advantageously spread any such quantization noise over a wider bandwidth, thereby also reducing the effect of spurs in δ(k).

Figure 5:
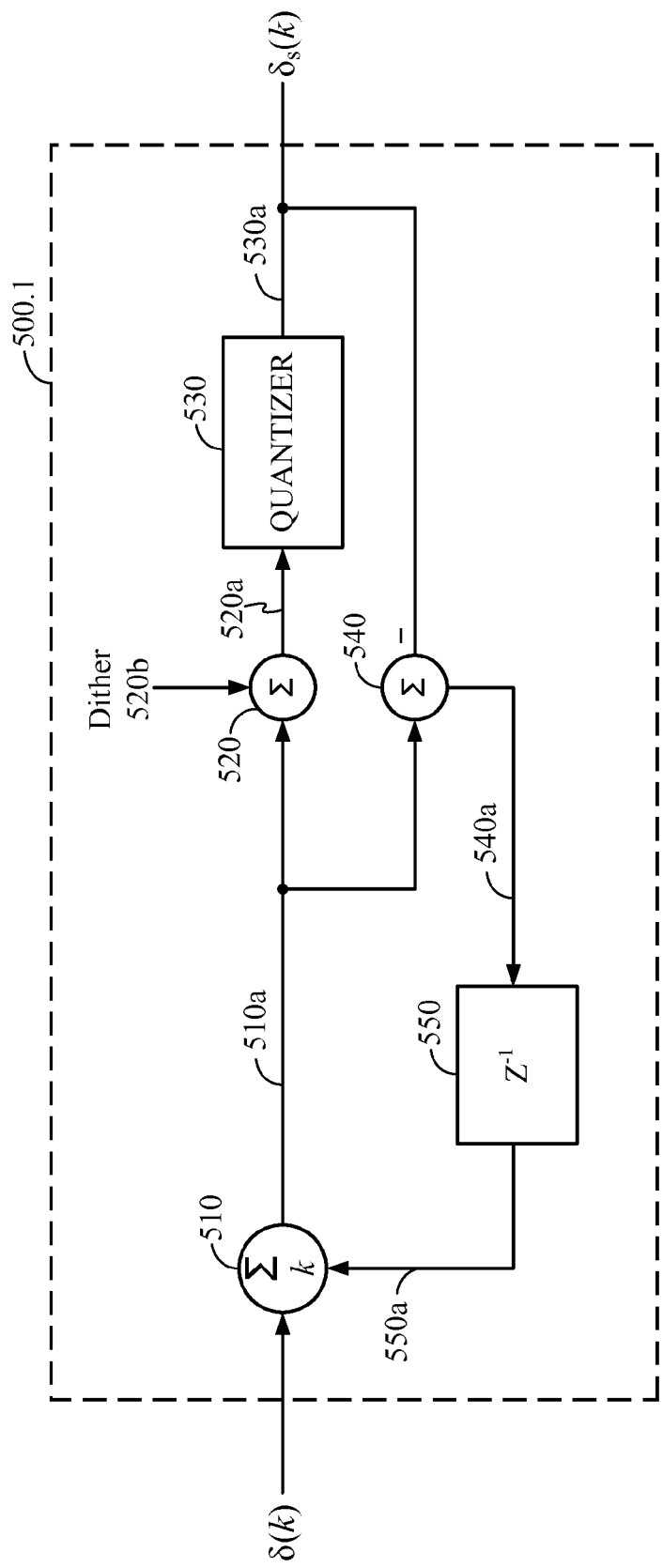
FIG. 5 illustrates an exemplary embodiment of a noise shaping block for processing $\delta(k)$ to generate a noise-shaped signal $\delta_s(k)$.

FIG. 5 illustrates an exemplary embodiment 500.1 of a noise shaping block for processing δ(k) to generate a noise-shaped signal $δ_s(k)$. Note the noise shaping block 500.1 is shown for illustrative purposes only, and is not meant to limit the scope of the present disclosure to any particular techniques for noise shaping.

In FIG. 5, δ(k) is provided to a clocked summer 510, which also accepts a signal 550a as input. The clocked summer 510 adds δ(k) to 550a once every cycle k to generate a signal 510a. The signal 510a is provided to a summer 520, which adds a dithering signal 520b to the signal 510a. In an exemplary embodiment, the dithering signal 520b may be, e.g., a pseudorandom signal having amplitude less than a quantization step size of the following quantizer 530. In an exemplary embodiment, the amplitude of the dithering signal is uniformly distributed over a range $-q/2$ to $q/2$, wherein q is the quantization step size of the following quantizer 530. It will be appreciated that the addition of the dithering signal 520*b* may serve to spread the quantization noise in $\delta(k)$ over a wider bandwidth, as well as reduce spurious components present in the dithered signal $\delta_s(k)$.

The output 520*a* of the summer 520 is provided to a quantizer 530, which quantizes the signal 520*a* with a finite quantization step size. The quantizer 530 may correspond, e.g., to a function performed by the DTC 220 shown in FIG. 2. The output 530*a* of the quantizer may correspond to the noise-shaped delay $\delta_s(k)$. In an exemplary embodiment, the noise-shaped delay $\delta_s(k)$ may be used in place of the delay $\delta(k)$ in FIG. 2 for delaying the intermediate signal x. The signal 530*a* is also provided to a summer 540, which subtracts 530*a* from 510*a* to generate a signal 540*a*. Signal 540*a* is provided to a delay unit 550, which generates a delayed signal 550*a* to be accumulated with $\delta(k)$ using clocked summer 510.

It will be appreciated that the noise-shaping scheme 500.1 is an example of a first-order sigma-delta modulation scheme. One of ordinary skill in the art will appreciate that in alternative exemplary embodiments, this scheme may readily be replaced by other sigma-delta modulation schemes, e.g., second- or third-order sigma-delta modulation schemes. Furthermore, it will be appreciated that architectures known as "error feedback" architectures for delta-sigma modulation may be employed in the design of blocks 400 and 500.1 described herein, and techniques known in the art for designing such architectures are contemplated to be within the scope of the present disclosure. Delta-sigma modulation schemes are further described in, e.g., Schreier, Richard, et al., *Understanding delta-sigma data converters*, IEEE Press (2005). Alternative exemplary embodiments incorporating sigma-delta modulation schemes known in the art are also contemplated to be within the scope of the present disclosure.

In an exemplary embodiment, a decimated signal having a quadrature phase relationship to the decimated signal y2 may be generated according to the present disclosure. For example, for the exemplary embodiment wherein f1/f2=2.25, the division ratio at a cycle k for a quadrature signal y2$_Q$, may be generated according to the following equation (Equation 3):

$$\Delta_Q(k) = \Delta(k+2);$$

and the delay at a cycle k may be generated according to the following equation (Equation 4):

$$\delta_Q(k) = frac\left[\delta(k) + \frac{9}{16}\right].$$

In light of the present disclosure, one of ordinary skill in the art may readily derive corresponding equations for generating a quadrature decimated signal for other ratios of f1/f2, and such alternative exemplary embodiments are contemplated to be within the scope of the present disclosure.

Figure 6:
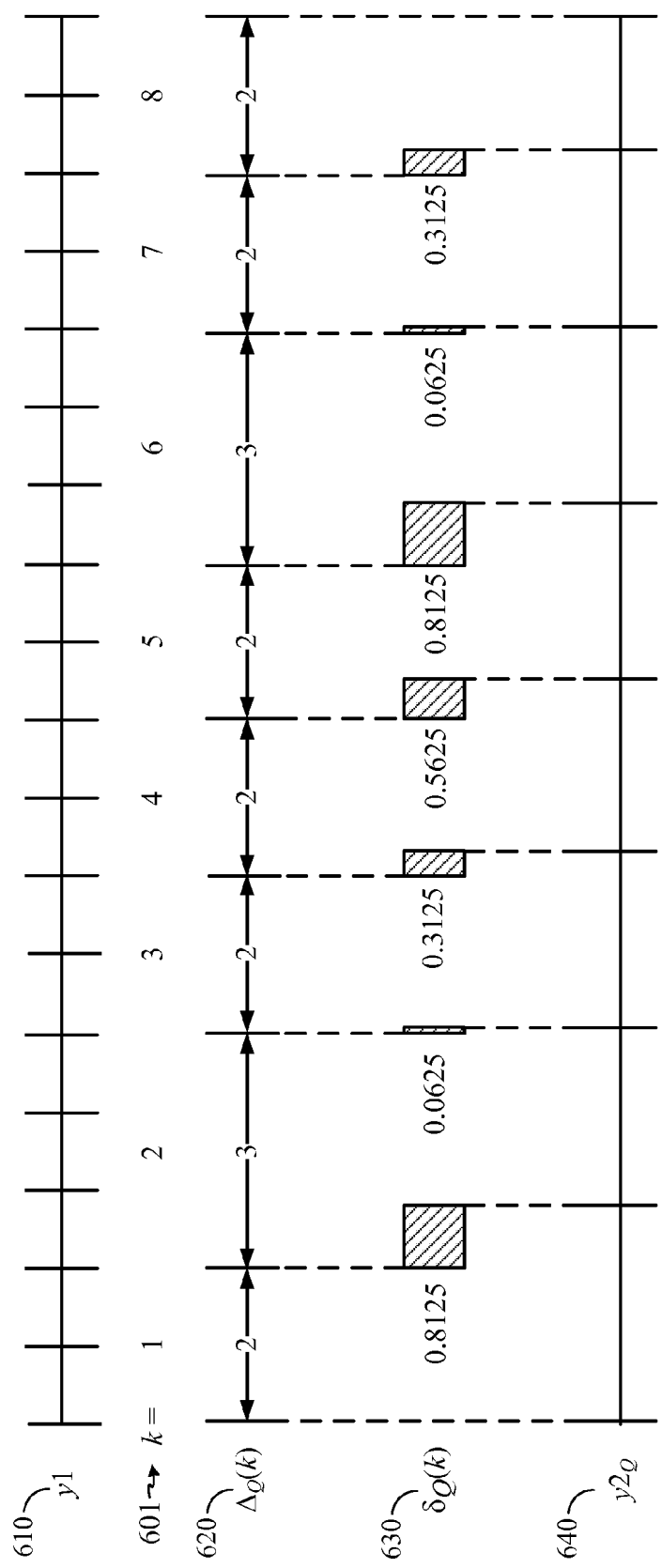
FIG. 6 illustrates an example of the operation of the decimation block for generating a decimated signal $y2_Q$, having a quadrature phase relationship to the signal y2 illustrated in FIG. 3.

FIG. 6 illustrates an example of the operation of the decimation block 200 for generating a decimated signal y2$_Q$, having a quadrature phase relationship to the signal y2 illustrated in FIG. 3. In FIG. 6, a signal y1 is shown at 610. Cycles k of y1 are enumerated at 601. At 620, the division ratio $\Delta_Q(k)$ as computed from Equation 3 is shown versus k. The signal y1 is seen to be divided by a ratio of 2 for k equals 1, by a ratio of 3 for k equals 2, and again by a ratio of 2 for k equals 3 and 4, etc. At 630, the delay $\delta_Q(k)$ as computed from Equation 4 is shown versus k. To generate y2$_Q$, the version of y1 divided by $\Delta_Q(k)$ is seen to be delayed by corresponding amounts 0.8125, 0.0625, 0.3125, 0.5625, etc. At 640, the signal edges of y2$_Q$, are shown.

Figure 7A:
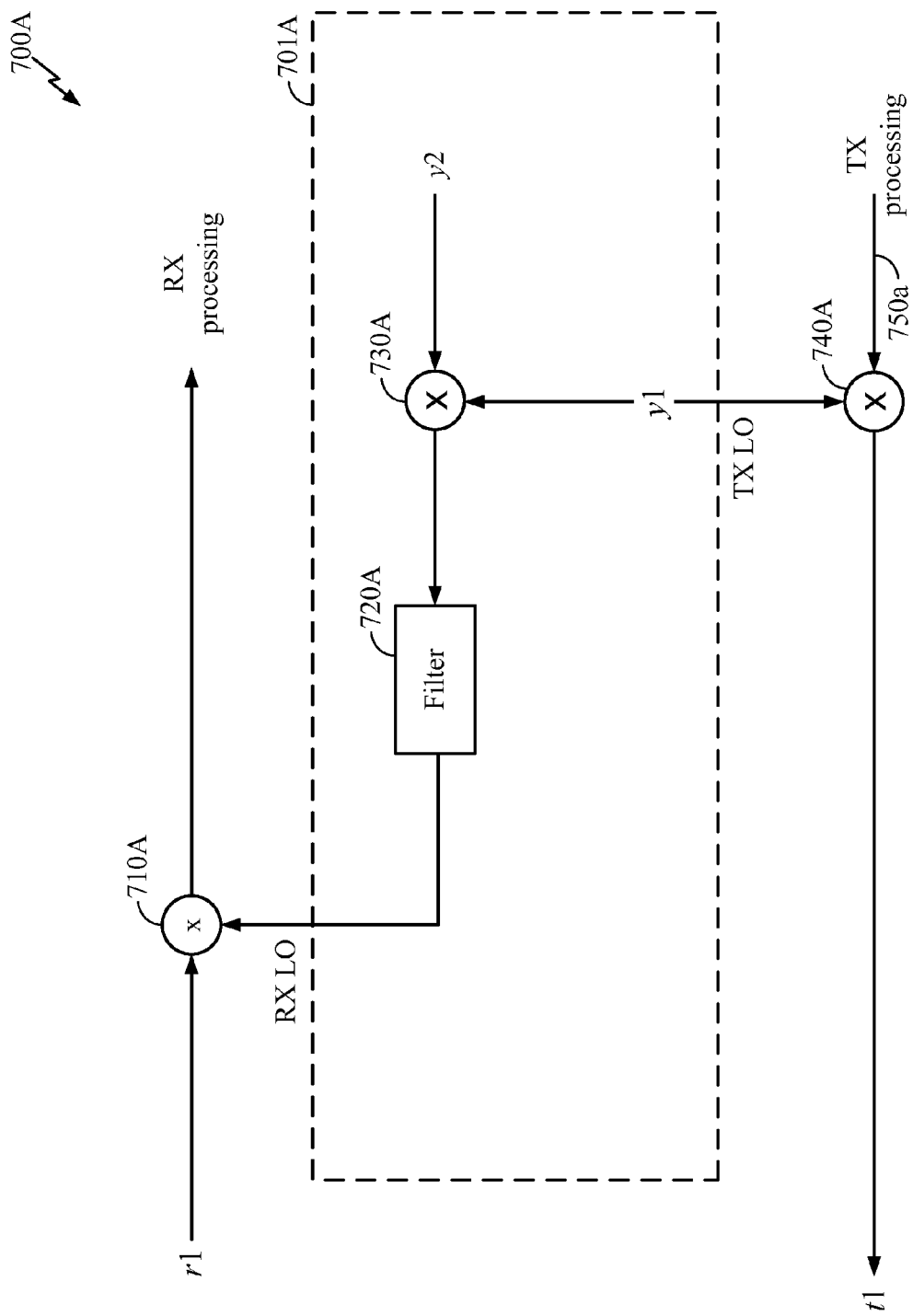
FIG. 7A illustrates an exemplary embodiment of a communications transceiver employing the signal y1 and the decimated signal y2.

FIG. 7A illustrates an exemplary embodiment 700A of a communications transceiver employing the signal y1 and the decimated signal y2. Note FIG. 7A is shown for illustrative purposes only, and is not meant to limit the scope of the present disclosure.

In FIG. 7A, a baseband signal to be transmitted 750*a* is provided to a mixer 740A. The mixer 740A mixes the signal 750*a* with the signal y1 generated by the TX-RX LO generator 701A, whose frequency f1 is chosen to correspond to the desired RF carrier frequency for the signal to be transmitted. The output of the mixer 740A may be transmitted as signal t1.

The signal y1 is further mixed using a mixer 730A with the decimated signal y2 generated by the TX-RX LO generator 701A. The output of the mixer 730A is filtered by a filter 720A to extract a carrier signal having frequency f1+f2. In an exemplary embodiment, the frequency f1+f2 may be chosen to correspond to the desired RF carrier frequency for the received signal, e.g., f2 may be chosen to correspond to the frequency offset between the TX and RX carrier frequencies for the transceiver 700A.

It will be appreciated that mixing with quadrature signals may be readily incorporated into the architecture shown in FIG. 7A. Furthermore, in alternative systems, the TX and RX carrier frequencies, and corresponding TX and RX LO's may readily be inter-changed. In yet alternative systems, the frequency f1 of signal y1 need not correspond to either of the TX or RX carrier frequencies, and may instead be another frequency. For example, f1 may be chosen such that f1+f2 corresponds to the TX carrier frequency, and f1−f2 corresponds to the RX carrier frequency, or vice versa. Such alternative exemplary embodiments are contemplated to be within the scope of the present disclosure.

Figure 7B:
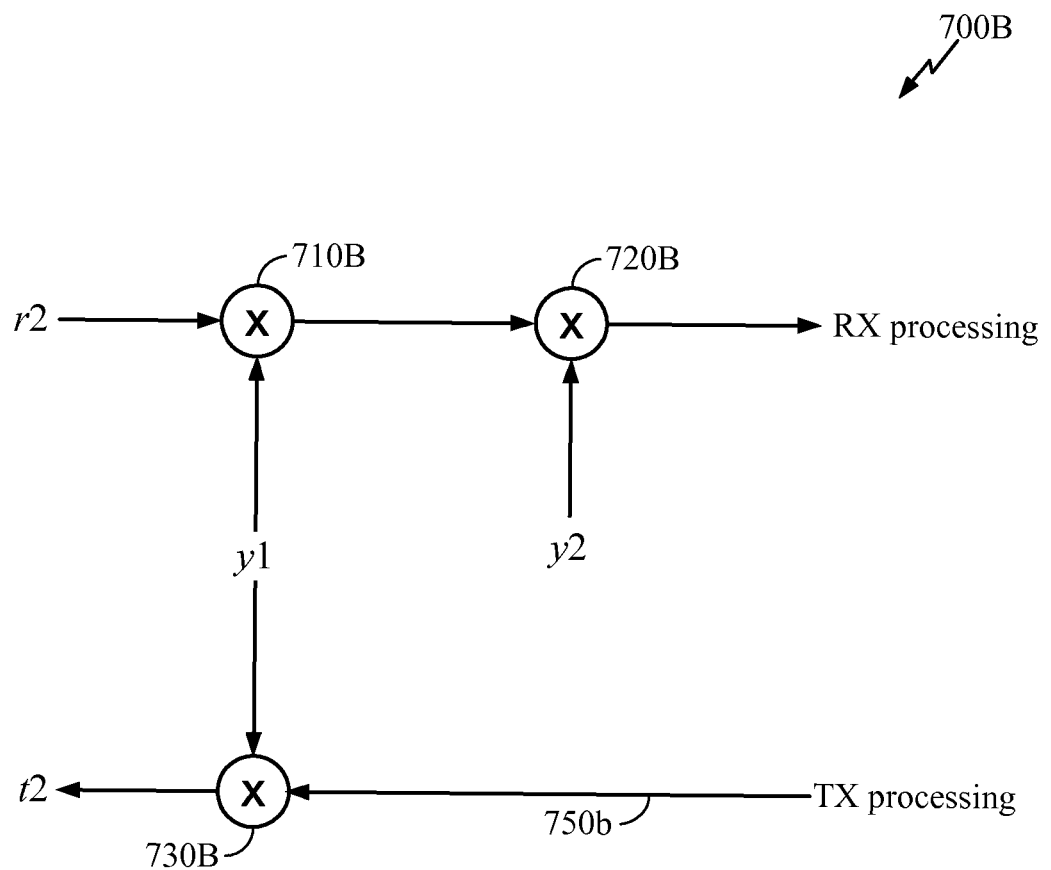
FIG. 7B illustrates an alternative exemplary embodiment of a communications transceiver employing the signal y1 and the decimated signal y2.

FIG. 7B illustrates an alternative exemplary embodiment 700B of a communications transceiver employing the signal y1 and the decimated signal y2. Note FIG. 7B is shown for illustrative purposes only, and is not meant to limit the scope of the present disclosure.

In FIG. 7B, a baseband signal to be transmitted 750*b* is provided to a mixer 730B. The mixer 730B mixes the signal 750*b* with the signal y1, whose frequency f1 is chosen to correspond to the desired RF carrier frequency for the signal to be transmitted. The output of the mixer 730B may be transmitted as signal t2.

The signal y1 is further provided to a mixer 710B, which mixes y1 with a received signal r2. The output of the mixer 710B is provided to a second mixer 720B, which mixes the output of the mixer 710B with the decimated signal y2. In an exemplary embodiment, the frequency f1 may be chosen to place the output of mixer 710B at a first intermediate frequency (IF) corresponding to f2, to be subsequently down-converted by the decimated signal y2.

Figure 8:
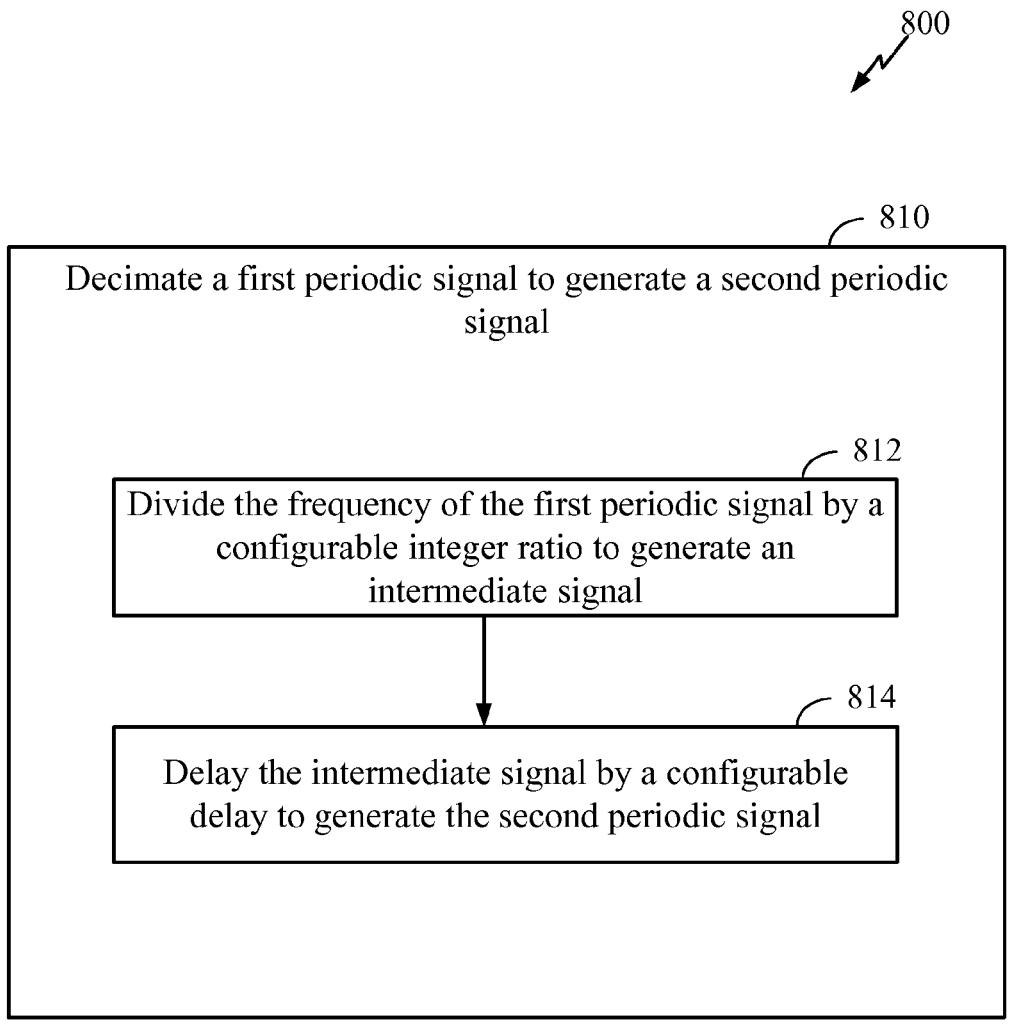
FIG. 8 illustrates an exemplary embodiment of a method according to the present disclosure.

FIG. 8 illustrates an exemplary embodiment of a method 800 according to the present disclosure. Note FIG. 8 is shown for illustrative purposes only, and is not meant to limit the scope of the present disclosure to any particular method.

In FIG. 8, at block 810, the method includes decimating a first periodic signal to generate a second periodic signal.

At block 812, the method includes dividing the frequency of the first periodic signal by a configurable integer ratio to generate an intermediate signal.

At block 814, the method includes delaying the intermediate signal by a configurable delay to generate the second periodic signal.

Figure 9:
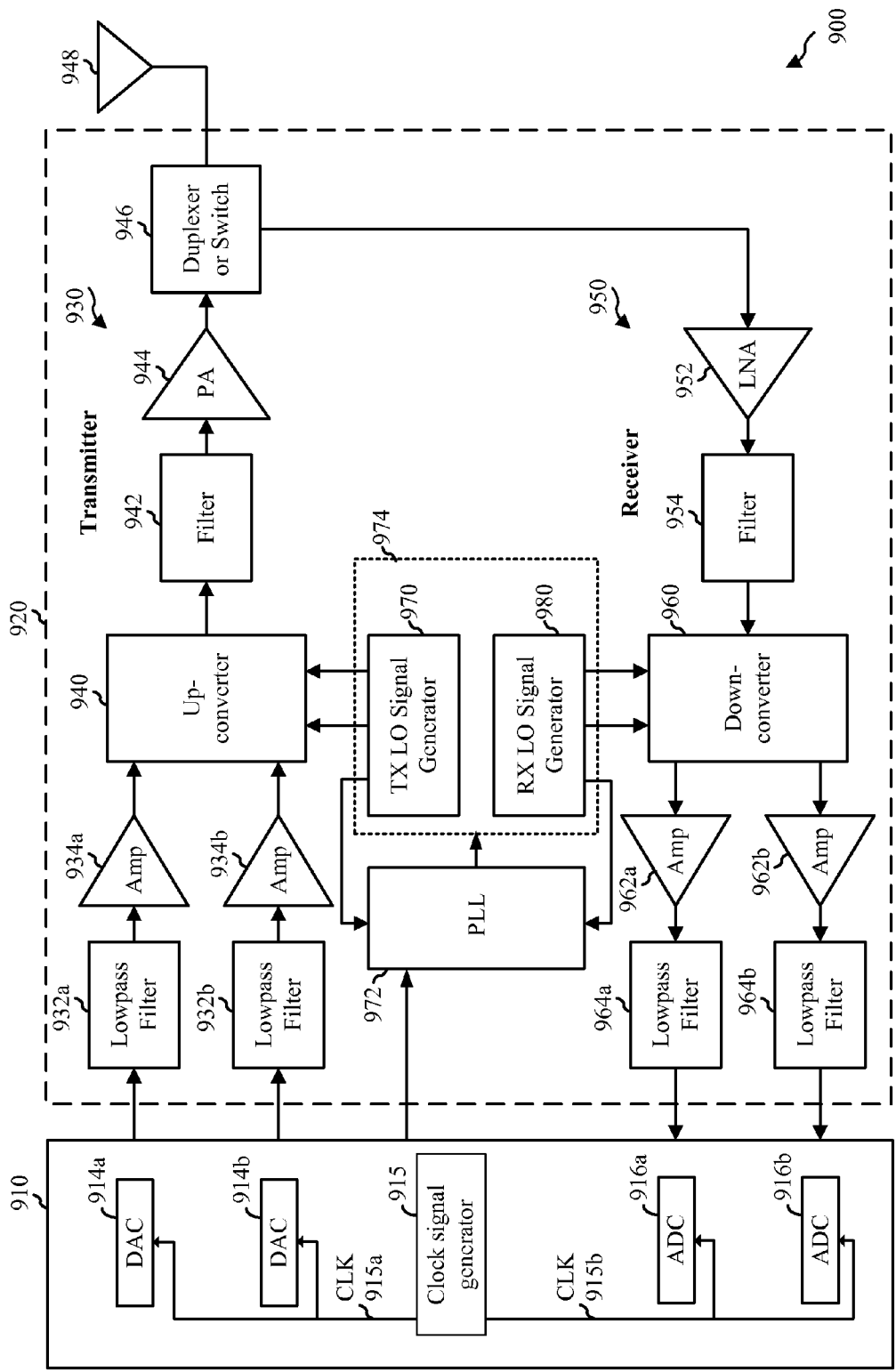
FIG. 9 illustrates a block diagram of a design of a wireless communication device in which the techniques of the present disclosure may be implemented.

FIG. 9 illustrates a block diagram of a design of a wireless communication device 900 in which the techniques of the present disclosure may be implemented. FIG. 9 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 9. Furthermore, other circuit blocks not shown in FIG. 9 may also be used to condition the signals in the transmitter and receiver. Some circuit blocks in FIG. 9 may also be omitted.

In the design shown in FIG. 9, wireless device 900 includes a transceiver 920 and a data processor 910. The data processor 910 may include a memory (not shown) to store data and program codes. Transceiver 920 includes a transmitter 930 and a receiver 950 that support bi-directional communication. In general, wireless device 900 may include any number of transmitters and any number of receivers for any number of communication systems and frequency bands. All or a portion of transceiver 920 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 9, transmitter 930 and receiver 950 are implemented with the direct-conversion architecture.

In the transmit path, data processor 910 processes data to be transmitted and provides I and Q analog output signals to transmitter 930. In the exemplary embodiment shown, the data processor 910 includes digital-to-analog-converters (DAC's) 914a and 914b for converting digital signals generated by the data processor 910 into the I and Q analog output signals. The DAC's 914a and 914b may each be provided with a clock signal 915a generated by a clock signal generator 915.

Within transmitter 930, lowpass filters 932a and 932b filter the I and Q analog output signals, respectively, to remove undesired images caused by the prior digital-to-analog conversion. Amplifiers (Amp) 934a and 934b amplify the signals from lowpass filters 932a and 932b, respectively, and provide I and Q baseband signals. An upconverter 940 upconverts the I and Q baseband signals with I and Q transmit (TX) local oscillating (LO) signals from a TX LO signal generator 970 and provides an upconverted signal. A filter 942 filters the upconverted signal to remove undesired images caused by the frequency upconversion as well as noise in a receive frequency band. A power amplifier (PA) 944 amplifies the signal from filter 942 to obtain the desired output power level and provides a transmit RF signal. The transmit RF signal is routed through a duplexer or switch 946 and transmitted via an antenna 948.

In the receive path, antenna 948 receives signals transmitted by base stations and provides a received RF signal, which is routed through duplexer or switch 946 and provided to a low noise amplifier (LNA) 952. The received RF signal is amplified by LNA 952 and filtered by a filter 954 to obtain a desirable RF input signal. A downconverter 960 downconverts the RF input signal with I and Q receive (RX) LO signals from an RX LO signal generator 980 and provides I and Q baseband signals. The I and Q baseband signals are amplified by amplifiers 962a and 962b and further filtered by lowpass filters 964a and 964b to obtain I and Q analog input signals, which are provided to data processor 910. In the exemplary embodiment shown, the data processor 910 includes analog-to-digital-converters (ADC's) 916a and 916b for converting the analog input signals into digital signals to be further processed by the data processor 910. The ADC's 916a and 916b may each be provided with a clock signal 915b generated by the clock signal generator 915.

The LO signal generator 974 includes TX LO signal generator 970 and RX LO signal generator 980. TX LO signal generator 970 generates the I and Q TX LO signals used for frequency upconversion. RX LO signal generator 980 generates the I and Q RX LO signals used for frequency downconversion. Each LO signal is a periodic signal with a particular fundamental frequency. A PLL 972 receives timing information from data processor 910 and generates a signal used to adjust the frequency and/or phase of the RX and TX LO signals generated by 970 and 980. In an exemplary embodiment, the PLL 972, TX LO signal generator 970, and RX LO signal generator 980 may incorporate the techniques of the present disclosure.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The invention claimed is:

1. A method for decimating a first periodic signal to generate a second periodic signal, the method comprising:
calculating a first ratio comprising a ratio of the frequency of the first periodic signal to the frequency of the second periodic signal;
storing an incrementing cycle index;
accumulating the first ratio with a delayed signal once per cycle index;
computing the floor function of the output of the accumulating to generate a configurable integer ratio;
dividing the frequency of the first periodic signal by the configurable integer ratio to generate an intermediate signal; and
delaying the intermediate signal by a configurable delay to generate the second periodic signal.

2. The method of claim 1, further comprising varying the configurable integer ratio if the first ratio has a non-zero fractional portion.

3. The method of claim 2, further comprising storing an incrementing cycle index, the varying the configurable integer ratio comprising:
subtracting a second coefficient from a first coefficient, the second coefficient comprising the floor function of the first ratio times one less than the cycle index, the first coefficient comprising the floor function of the first ratio times the cycle index.

4. The method of claim 1, the delaying by the configurable delay comprising:
delaying by less than one period of the first periodic signal.

5. The method of claim 4, the delaying by less than one period comprising delaying the intermediate signal by one period of the first periodic signal times the fractional portion of the first ratio times the cycle index.

6. The method of claim 1, further comprising:
subtracting the output of the floor function from the output of the accumulating to generate the configurable delay.

7. The method of claim 1, further comprising:
subtracting the output of the floor function from the output of the accumulating to generate a first delay; and
noise-shaping the first delay to generate the configurable delay.

8. The method of claim 7, the noise-shaping comprising applying a first-order sigma-delta modulation to the first delay.

9. The method of claim 1, further comprising:
mixing a received signal with a product of the first and second periodic signals.

10. The method of claim 9, further comprising:
mixing a signal to be transmitted with the first periodic signal.

11. The method of claim 1, further comprising:
mixing a signal to be transmitted with a product of the first and second periodic signals; and
mixing a received signal with the first periodic signal.

12. The method of claim 1, further comprising:
mixing a received signal with the first periodic signal;
processing the output of the mixing with the first periodic signal; and
mixing the output of the processing with the second periodic signal.

13. The method of claim 1, further comprising:
decimating the first periodic signal to generate a second quadrature periodic signal, the decimating to generate the second quadrature signal comprising:
dividing the frequency of the first periodic signal by a configurable quadrature integer ratio to generate an intermediate quadrature signal; and
delaying the intermediate quadrature signal by a configurable quadrature delay to generate the second quadrature periodic signal.

14. An apparatus configured to store an incrementing cycle index and to calculate a first ratio comprising a ratio of a frequency of a first periodic signal to a frequency of a second periodic signal, the apparatus comprising:
a clocked summer configured to accumulate the first ratio with a delayed signal once per cycle index;

a floor function block configured to compute a floor function of an output of the clocked summer to generate a configurable integer ratio;

an integer division block configured to divide the frequency of a first periodic signal by the configurable integer ratio to generate an intermediate signal; and a delay block configured to delay the intermediate signal by a configurable delay to generate the second periodic signal.

15. The apparatus of claim 14, wherein the configurable integer ratio is varied when the first ratio has a non-zero fractional portion.

16. The apparatus of claim 14, further comprising a ratio generation block configured to subtract a second coefficient from a first coefficient, the second coefficient comprising the floor function of the first ratio times one less than the cycle index, the first coefficient comprising the floor function of the first ratio times the cycle index.

17. The apparatus of claim 14, the delay block configured to delay the intermediate signal by a configurable delay less than one period of the first periodic signal.

18. The apparatus of claim 17, the delay block configured to delay the intermediate signal by one period of the first periodic signal times the fractional portion of the first ratio times the cycle index.

19. The apparatus of claim 14, further comprising:
a summer configured to subtract the output of the floor function block from the output of the clocked summer to generate the configurable delay.

20. The apparatus of claim 14, further comprising:
a summer configured to subtract the output of the floor function block from the output of the clocked summer to generate a first delay; and
a noise-shaping block configured to noise-shape the first delay to generate the configurable delay.

21. The apparatus of claim 20, the noise-shaping block comprising a first-order sigma delta modulator.

22. The apparatus of claim 14, further comprising:
a mixer configured to mix a received signal with a product of the first and second periodic signals.

23. The apparatus of claim 22, further comprising:
a mixer configured to mix a signal to be transmitted with the first periodic signal.

24. The apparatus of claim 14, further comprising:
a mixer configured to mix a signal to be transmitted with a product of the first and second periodic signals; and
a mixer configured to mix a received signal with the first periodic signal.

25. The apparatus of claim 14, further comprising:
a first mixer configured to mix a received signal with the first periodic signal;
a second mixer configured to mix a processed output of the first mixer with the second periodic signal.

26. The apparatus of claim 14, further comprising:
a quadrature integer division block configured to divide the frequency of the first periodic signal by a configurable quadrature integer ratio to generate an intermediate quadrature signal; and a quadrature delay block configured to delay the intermediate quadrature signal by a configurable quadrature delay to generate a second quadrature periodic signal.

27. A device for wireless communications, the device comprising at least one baseband TX amplifier for amplifying an analog TX signal, an LO signal generator comprising a TX LO signal generator and an RX LO signal generator, an upconverter coupled to the TX LO signal generator and the at least one baseband TX amplifier, a TX filter coupled to the output of the upconverter, a power amplifier (PA) coupled to the TX filter, an RX filter, a low-noise amplifier (LNA) coupled to the RX filter, a downconverter coupled to the RX LO signal generator and the RX filter, and at least one low-pass filter coupled to the output of the downconverter, the LO signal generator comprising:

an integer division block configured to divide the frequency of a first periodic signal by a configurable integer ratio to generate an intermediate signal; and a delay block configured to delay the intermediate signal by a configurable delay to generate the second periodic signal; at least one of the TX LO signal generator and the RX LO signal generator configured to buffer the first periodic signal as the LO signal.

28. The device of claim 27, the LO signal generator further comprising a mixer for mixing the first and second periodic signals, at least one of the TX LO signal generator and the RX LO signal generator configured to buffer an output product of the mixer as the LO signal.

29. The device of claim 27, the LO signal generator further comprising a quadrature integer division block configured to divide the frequency of the first periodic signal by a configurable quadrature integer ratio to generate an intermediate quadrature signal; and a quadrature delay block configured to delay the intermediate quadrature signal by a configurable quadrature delay to generate a second quadrature periodic signal.

30. A non-transitory computer-readable medium storing code for causing a computer to decimate a first periodic signal to generate a second periodic signal, the code comprising:
code for causing a computer to calculate a first ratio comprising a ratio of the frequency of the first periodic signal to the frequency of the second periodic signal;
code for causing a computer to store an incrementing cycle index;
code for causing a computer to accumulate the first ratio with a delayed signal once per cycle index;
code for causing a computer to compute the floor function of the output of the accumulating to generate a configurable integer ratio;
code for causing a computer to divide the frequency of the first periodic signal by the configurable integer ratio to generate an intermediate signal; and
code for causing a computer to delay the intermediate signal by a configurable delay to generate the second periodic signal.

* * * * *